(12) United States Patent
Terhaar et al.

(10) Patent No.: US 6,535,383 B2
(45) Date of Patent: Mar. 18, 2003

(54) CLAMSHELL HEATSINK

(75) Inventors: Mandy G. Terhaar, Tualatin, OR (US);
Cheryl M. Floyde, Aloha, OR (US);
George Hsieh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/901,407

(22) Filed: Jul. 9, 2001

(65) Prior Publication Data

US 2003/0007326 A1 Jan. 9, 2003

(51) Int. Cl.7 .................................................. H05H 7/20
(52) U.S. Cl. ...................... 361/690; 165/80.2; 165/80.3;
165/185; 257/719; 257/726; 257/707; 361/704;
361/707; 361/710
(58) Field of Search ............................... 165/80.2, 80.3,
165/185; 174/16.3; 257/706–707, 712–713,
722, 718–719, 726–727; 361/688, 690,
704, 707, 709–710, 717–722

(56) References Cited

U.S. PATENT DOCUMENTS

| 3,572,428 A | * | 3/1971 | Monaco ..................... 165/80.2 |
|---|---|---|---|
| 4,764,847 A | * | 8/1988 | Eisenblatter et al. ......... 361/707 |
| 5,175,668 A | * | 12/1992 | Kendel ........................ 361/704 |
| 5,592,021 A | | 1/1997 | Meschter et al. ............ 257/727 |
| 6,093,961 A | * | 7/2000 | Mccullough ................. 257/718 |
| 6,097,603 A | | 8/2000 | Edwards et al. ............. 361/719 |
| 6,118,660 A | * | 9/2000 | Kaufman ..................... 361/704 |
| 6,178,628 B1 | | 1/2001 | Clemens et al. .............. 29/840 |
| 6,215,662 B1 | | 4/2001 | Peter et al. .................. 361/704 |
| 6,219,246 B1 | * | 4/2001 | Edevold et al. ............. 361/707 |
| 6,219,248 B1 | | 4/2001 | Werner et al. ............... 361/719 |
| 6,310,776 B1 | * | 10/2001 | Byrne et al. ................. 361/707 |

* cited by examiner

Primary Examiner—Gregory Thompson
(74) Attorney, Agent, or Firm—Schwegman, Lundberg, Woessner & Kluth, P.A.

(57) ABSTRACT

A heatsink which includes a body having a first arm and a second arm and having a mounting area between the first arm and the second arm. The mounting area is dimensioned to hold a heat generating electronic component. The mounting area is dimensioned so that when the component is located within the mounting area, the first arm and the second arm apply opposing forces against the component so that the component is held within the mounting area by the first arm and the second arm.

18 Claims, 4 Drawing Sheets

CLAMSHELL HEATSINK

TECHNICAL FIELD

The present invention relates generally to electrical devices and more particularly relates to an apparatus and method for providing a heat sink for a heat generating electrical component.

BACKGROUND

Electronic components, such as field-effect transistors (FET), are mounted to circuit boards for use in a variety of electrical devices, such as computers. While such electrical devices are becoming more complex, consumers demand ever-smaller sizes for the devices. Accordingly, as the circuit boards become more complex, more electrical components are being forced into smaller and smaller spaces.

However, the electrical components develop heat when used. The heat must be removed from the components for the devices to function without degradation or failure of the device.

One method of removing heat from electrical components is the use of heatsinks attached to the components. For the heatsink to remove heat from the components, the heatsink must be thermally and mechanically coupled to the component. Some electronic components are provided in packages of a standard style, e.g., type TO-220, TO-218, etc. These packages typically include a hole for passing a screw. The screw is used to attach a heat sink to the package. This attachment technique occupies a lot of space on the printed circuit board. The problem is made worse by the fact that many components, such as FETs, are typically clustered together for sharing between them the electrical load. All of them require a heat sink, and therefore each requires a lot of space around it. Accordingly, the cluster of FETs occupies a large area of the circuit board.

Moreover, when the FETs are mounted to a circuit board, a separate heatsink must be screwed to each separate FET and then each of the completed FET/heatsink assemblies is separately mounted to the circuit board. This is a complicated, time-consuming, and labor-intensive process which can cause delays and errors in manufacturing and increase in cost.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
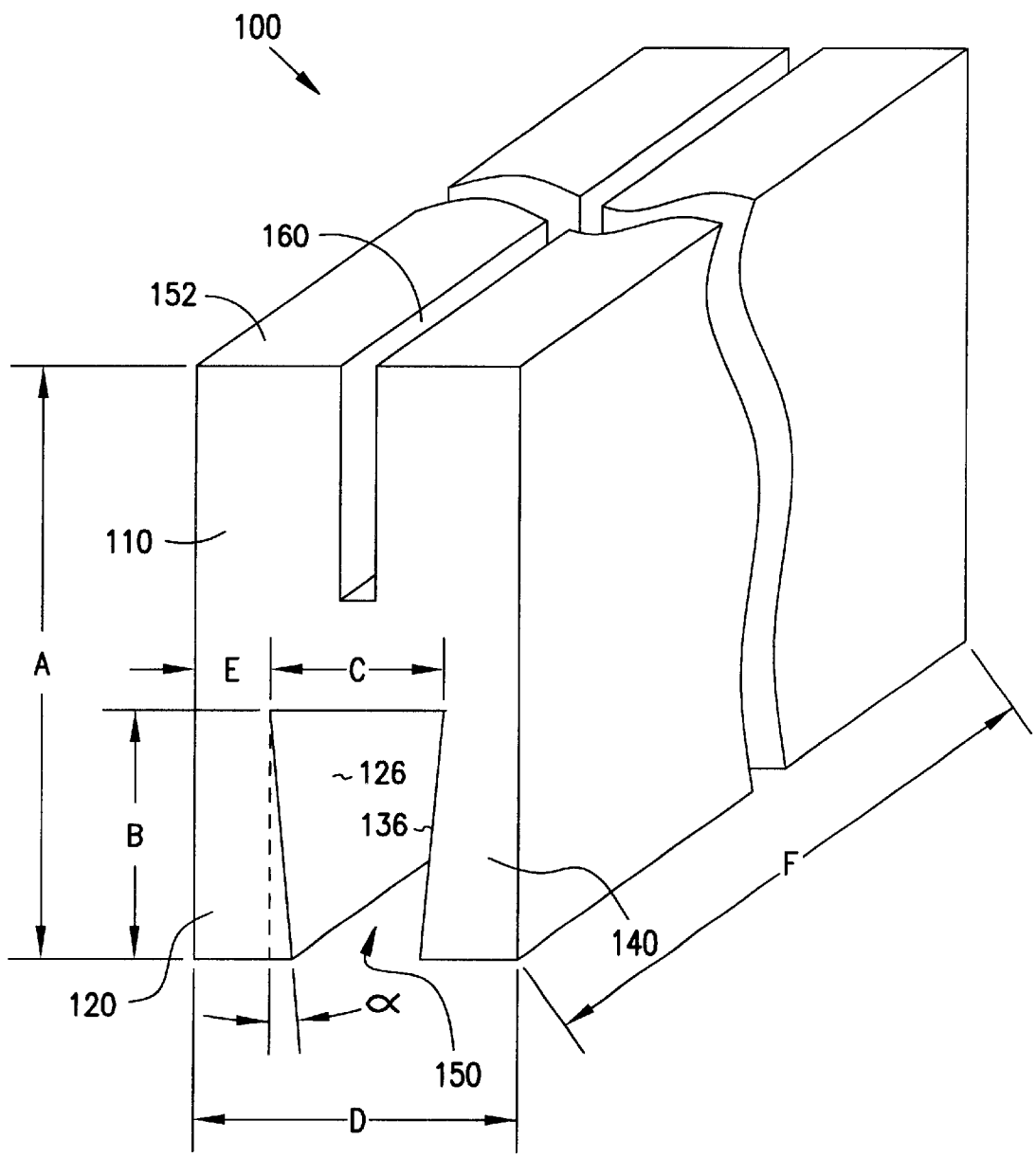
FIG. 1 is an isometric view of a heatsink according to one embodiment.

FIG. 1 is an isometric view of a heatsink 100 according to one embodiment. As noted above, electrical components, such as FETs, develop heat when used. The heat must be removed from the components for them to function in a long-term manner. Heatsink 100 provides an integral clamping mechanism for one or more devices such as FETs to be mounted thereto without requiring the use of any external fasteners. As will be discussed below, this allows heatsink 100 to be used with a plurality of components and allows for simple assembly.

Heatsink 100 generally includes a main body 110 having a first arm 120 and a second arm 140 extending from the sides of the main body, thus forming a U-shaped, clamshell type structure when viewed from the end. A mounting area 150 is defined between first arm 120 and second arm 140. Mounting area 150 is for mounting an electrical component, for example a TO-220 type FET, to the heatsink 100. A channel or groove 160 is formed in an upper surface 152 of the heatsink. As will be discussed below, in some embodiments the size of mounting area 150 can be modified to allow for mounting of other sizes of components, such as TO-218 FETs, for example.

In one embodiment, heatsink 100 is a unitary structure manufactured from 6061 T6 Aluminum. The heatsink is manufactured by molding, cutting, extruding, machining, sawing, forming of sheet metal material, or otherwise fashioning the base 6061 T6 Aluminum material into the structure of heatsink 100. In some embodiments, other thermally conductive materials having flexible or springy characteristics, such as other aluminums, coppers, and alloys thereof can be used.

In one embodiment, first arm 120 includes an inner surface 126. Inner surface 126 is angled or tapered inward. In a similar manner, second arm 140 includes an inner surface 136 which is tapered inward. In this example, the arms have a tapered surface having an angle α of approximately 5 degrees relative to the vertical axis of the heatsink. This structure gives mounting area 150 a generally trapezoidal shape in a cross-section view.

In one embodiment, the dimensions of heatsink 100 include an overall height A of approximately 1.6 inches, a first and second arm height B of approximately 0.64 inches, an overall width D of approximately 0.486 inches, a gap 160 width of approximately 0.194 inches, a gap 160 depth of approximately 0.64 inches, a mounting area inner width C of approximately 0.36 inches, a base arm width E of approximately 0.0632 inches, and an overall length F of approximately 6 inches.

These dimensions can be varied depending on the size of the electrical component to be mounted to the heatsink and the material used for the heatsink. The example given is for mounting a TO-220 type FET package to a 6061 T6 Aluminum heatsink. As will be discussed below, these dimensions and material provide the proper spring force by arms 120 and 140 to hold one or more TO-220 FET packages within mounting area 150.

Figure 2:
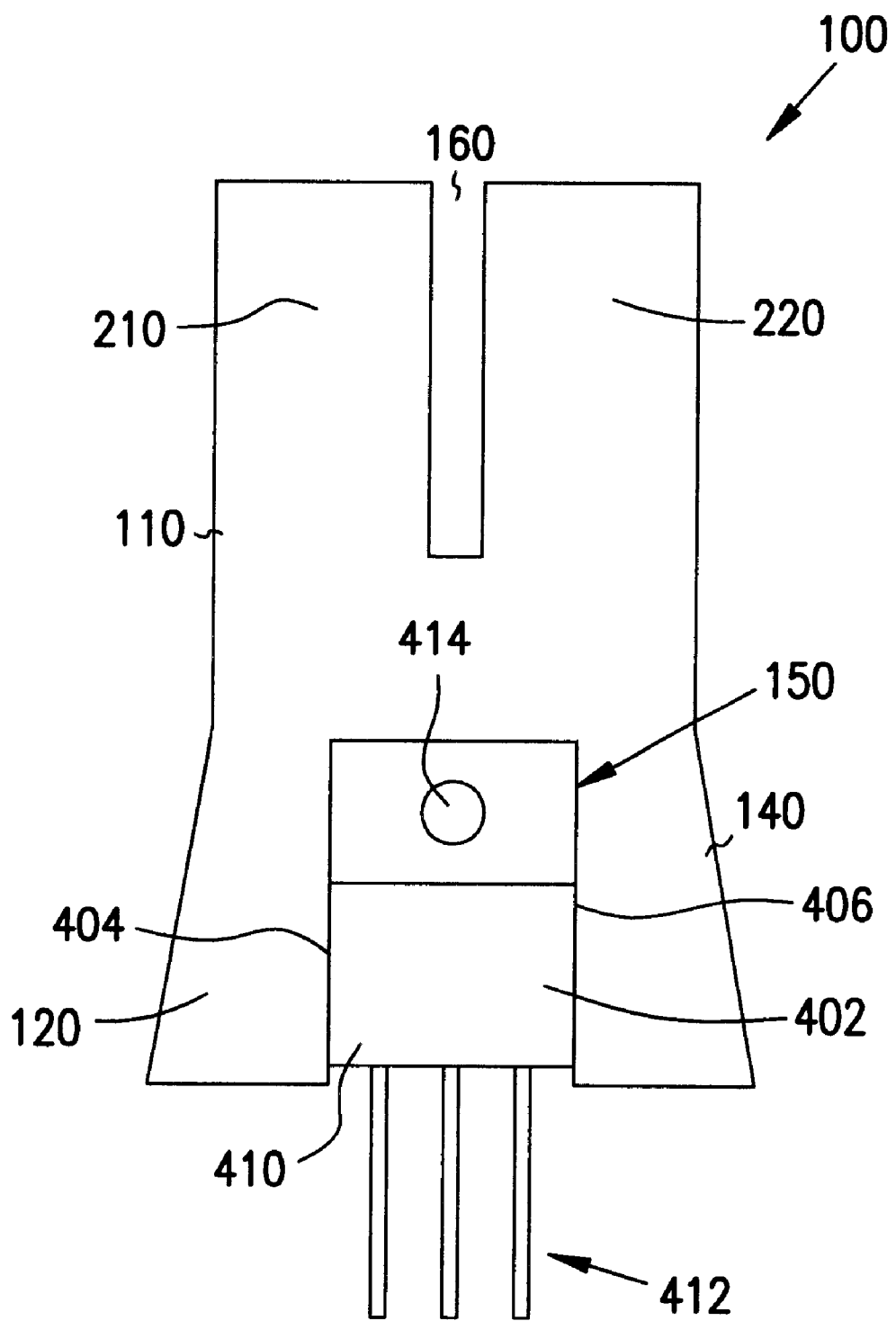
FIG. 2 shows a front view of a TO-220 type FET mounted in the heatsink of FIG. 1.

FIG. 2 shows a front view of heatsink 100 having an electronic component 402, such as a FET of package type TO-220, mounted thereto. The example FET includes a chip encased in a block 410. A typical block size for such packages have a width of approximately 10.0 mm to 10.6 mm (0.394 inches to 0.417 inches). One or more conductors 412, which are electrically connected to the chip, extend from block 410 for connecting to a printed circuit board. In the past, when a TO-220 type FET, such as component 402, was mounted to a circuit board, a separate heatsink is screwed to the mounting hole 414 of each separate FET package. This is a time consuming process. Moreover, when a cluster of FETs are needed, the overall size of all the FET/heatsink assemblies creates a problem.

In this example, mounting area 150 is dimensioned so that FET package 410 forces the first and second arms, 120 and 140, away from each other. This elastic deflection of one or both of the arms creates a counter-acting spring force of the first and second arms against side surfaces 404 and 406 of FET 402.

Upper portions 210 and 220 of heatsink 100 are on either side of groove 160. In one example, upper portions 210 and 220 are squeezed towards each other to widen mounting area 150 to prepare for mounting a component therein. Once the FET package is positioned within mounting area 150, portions 210 and 220 are released and arms 120 and 140 are forced against the component body.

It is noted that groove 160 also increases the heat-dissipation properties of the heatsink by providing extra surface area. In some embodiments, more grooves are configured on the heatsink or fins can be implemented either integral with or attached to the heatsink structure.

The structure of heatsink 100 gives a connection force without the use of any external fasteners. This allows for easy manufacturing. Moreover, mounting area 150 is dimensioned relative to the size of the FET 402 so that the surfaces 404 and 406 of the FET are substantially flush along the inner surfaces 126 and 136 (as shown in FIG. 1) of the heatsink, respectively, when the FET is mounted therein. This provides optimal heat transfer from the FET to the heatsink.

In this example, 6061 T6 Aluminum is used. Based on this material, its modulus of elasticity, and the dimensions given above, the present structure holds its elastic state when the TO-220 type FETs are mounted in place. The displacement placed on the heatsink when the TO-220 type FETs are inserted into it is between 0.04 and 0.06 inches. The present example provides a compression force of approximately 22 lbs. to 33 lbs., depending on TO-220 FET thickness variations. This load meets the thermal requirement for the heatsink and therefore this design generates clamping pressure without yielding.

Figure 3:
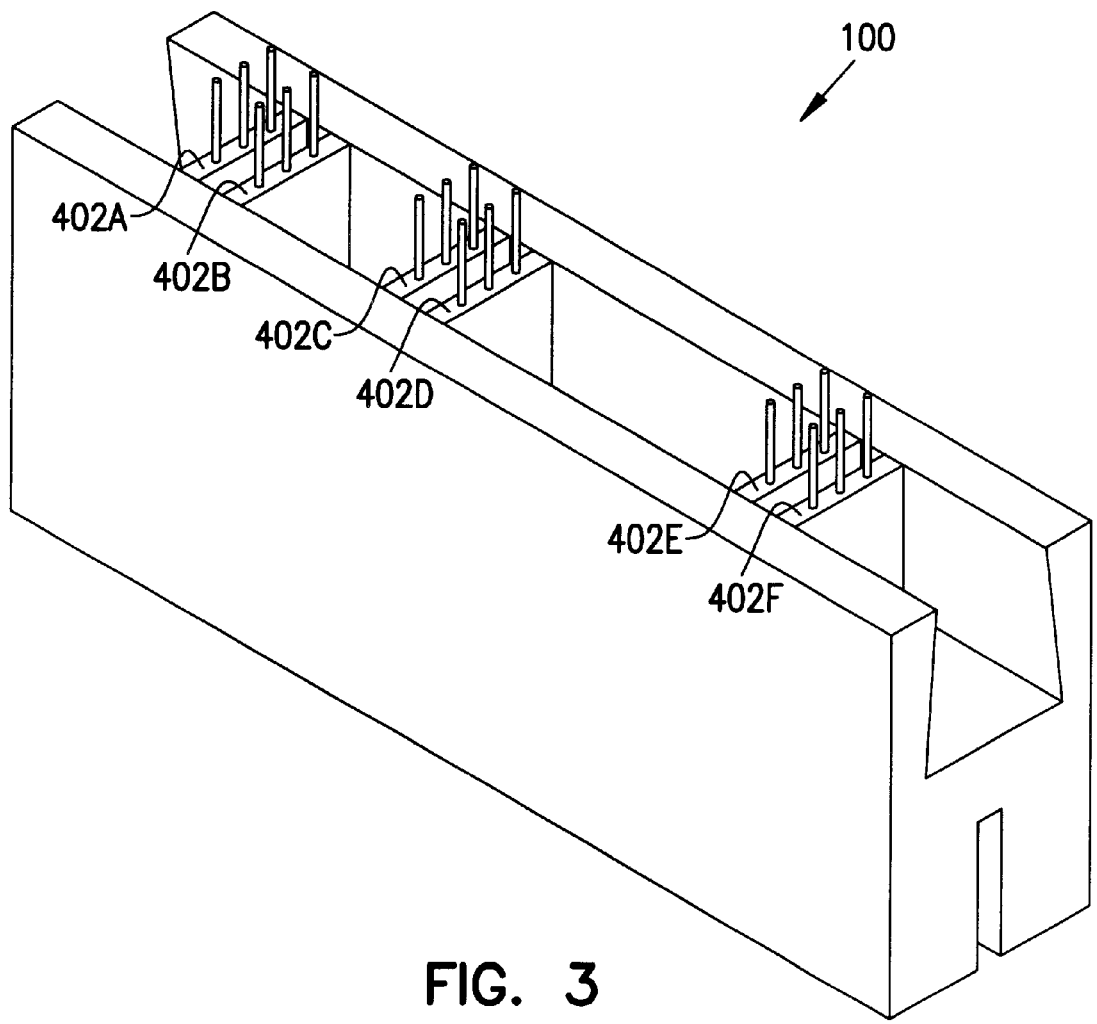
FIG. 3 shoves one example of a cluster of six FETs mounted in the heatsink of FIG. 1.

FIG. 3 shows an example of six FETs 402A–402F mounted to heatsink 100. This is advantageous when a cluster of voltage regulation transistors are located in close proximity on a printed circuit board. Since only a single heatsink is needed for a plurality of packages and since no external fasteners are required, the process of mounting the components to the heatsink is decreased in complexity and time. Moreover, the space taken up by the completed assembly is smaller than the size of a corresponding cluster of FET packages each having there own heatsink. Those skilled in the art will recognize that the present system can be adapted for use with a cluster of FETs of almost any number.

Figure 4:
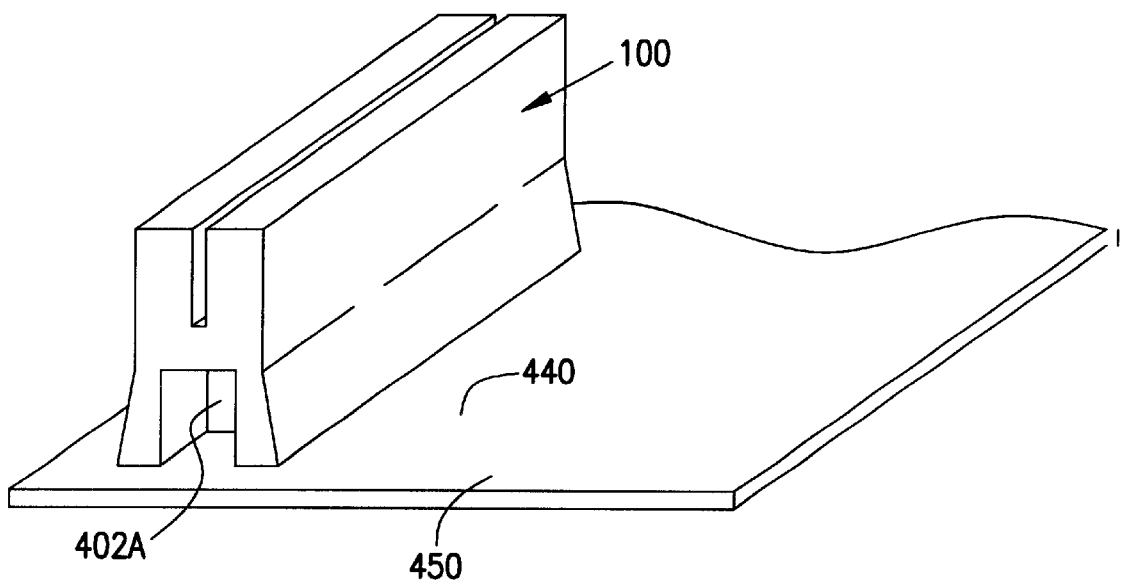
FIG. 4 shows an isometric view of the heatsink assembly of FIG. 1 mounted on a circuit board.

FIG. 4 shows an isometric view of heatsink 100 having the six FETs of FIG. 3 mounted to it and mounted to a mounting surface 440 of a printed circuit board 450. In one method of assembling a circuit board, the heatsink assembly is mounted to the printed circuit board in the final stage of production. Again, the present system does not require any additional steps of heatsink preparation. Moreover, a plurality of FETs can be mounted to a single heatsink without any external hardware.

In one example, the present system allows the heatsink to be secured to an electronic component at the same time the component is being mounted to the circuit board, as opposed to doing so in a separate step in the assembly process. Heatsink 100 thereby simplifies the assembly process by eliminating steps in the manufacturing process and by allowing for the further automation of the assembly process.

The present system has been described in light of TO-220 packaged FETs mounted on a printed circuit board. However, one or more of the examples given herein also apply to any heat generating electronic device package which is surface mounted to a substrate, such as a printed circuit board.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present invention. The scope of the invention should, therefore, be determined with reference to the appended claims, along with the full scope of equivalents to which such claims are entitled.

What is claimed is:

1. A heatsink for an electronic component, the heatsink comprising:

a generally solid metal block body including a bottom surface and an opposing top surface, the body having a first arm and a second arm and having an elongated mounting area between the first arm and the second arm and located on the bottom surface, the body further having an elongated groove on the top surface of the body, the elongated groove defining a first upper portion and a second upper portion of the heatsink, wherein the mounting area of the heatsink can be widened by squeezing the first upper portion and the second upper portion towards each other, wherein the elongated mounting area is dimensioned to hold a plurality of electronic components along the length of the body, and so that when the electronic components are located within the mounting area, the first arm and the second arm apply opposing forces against the electronic components to hold the electronic components within the mounting area.

2. The heatsink of claim 1, wherein the heatsink includes 6061 T6 Aluminum.

3. The heatsink of claim 1, wherein the first arm includes an angled inner surface.

4. The heatsink of claim 1, wherein the first arm and the second arm include angled inner surfaces, wherein the mounting area has an approximately trapezoidal shape when the component is not mounted within the mounting area.

5. The heatsink of claim 1, wherein the mounting area is dimensioned to allow at least six electronic components to fit within the mounting area.

6. The heatsink of claim 5, wherein the mounting area is dimensioned to hold at least six electronic components including six TO-220 packaged FETs.

7. A heatsink for an electronic component, the heatsink comprising:

a thermally conductive unitary, generally solid body which includes an elongated mounting area on a lower surface of the body dimensioned to hold a plurality of electronic components and a longitudinal groove on an upper surface of the body defining a first upper portion and a second upper portion of the heatsink wherein the mounting area of the heatsink can be widened by squeezing the first upper portion and the second upper portion towards each other.

8. The heatsink of claim 7, wherein the body includes 6061 T6 Aluminum.

9. The heatsink of claim 7, wherein the mounting area includes a first arm and a second arm integrally attached to the body, wherein the mounting area is between the first arm and second arm.

10. The heatsink of claim 9, wherein when the component is located within the mounting area, the first arm and the second arm apply opposing forces against the component.

11. The heatsink of claim 7, wherein the mounting area is dimensioned to hold at least six TO-220 packaged FETs.

12. An electrical device comprising:

a circuit board having a mounting surface;

an electronic component mounted to the mounting surface; and a heatsink mounted to the electronic component, wherein the heatsink includes a thermally conductive, generally solid body which includes a mounting area on a lower surface of the body dimensioned to hold a plurality of electronic components and a longitudinal groove on an upper surface of the body defining a first upper portion and a second upper portion of the heatsink wherein the mounting area of the heatsink can be widened by squeezing the first upper portion and the second upper portion towards each other.

13. The electrical device of claim 12, further comprising six electronic components, wherein the heatsink is mounted to each of the six electronic components.

14. The electrical device of claim 12, wherein the mounting area includes a pair of arms on the heatsink having a mounting space between the pair of arms.

15. The electrical device of claim 12, wherein the body includes 6061 T6 Aluminum.

16. A method of attaching a heatsink to an electronic component, the method comprising squeezing a first upper portion and a second upper portion of the heatsink towards each other to open a mounting area of the heatsink; and mounting a plurality of electronic components within the mounting area.

17. The method of claim 16, wherein mounting a plurality of electronic components includes mounting a plurality of TO-220 packaged FET within the mounting area.

18. The method of claim 16, further comprising mounting six electronic components in the mounting area.

* * * * *

UNITED STATES PATENT AND TRADEMARK OFFICE
CERTIFICATE OF CORRECTION

PATENT NO. : 6,535,383 B2
DATED : March 18, 2003
INVENTOR(S) : Terhaar et al.

It is certified that error appears in the above-identified patent and that said Letters Patent is hereby corrected as shown below:

Column 3,
Line 56, delete "there" and insert -- their --, therefor.

Column 4,
Line 26, delete "an electronic component" and insert -- a plurality of electronic components --, therefor.
Line 60, delete "an electronic component" and insert -- a plurality of electronic components --, therefor.

Column 6,
Line 13, after "a" insert -- generally solid metal block --.
Line 13, delete "an electronic component" and insert -- a plurality of electronic components --, therefor.
Lines 17 and 19, delete "a" and insert -- said --, therefor.

Signed and Sealed this

Second Day of September, 2003

JAMES E. ROGAN
*Director of the United States Patent and Trademark Office*